United States Patent [19]

Ueda et al.

[11] 4,414,478

[45] Nov. 8, 1983

[54] ELECTRONIC SWITCHING DEVICE

[75] Inventors: Kenji Ueda, Otsu; Kiyoshi Miyamoto, Nagaokakyo, both of Japan

[73] Assignee: Omron Tateisi Electronics Co., Nagaokakyo, Japan

[21] Appl. No.: 240,939

[22] Filed: Mar. 5, 1981

[30] Foreign Application Priority Data

| | | | |
|---|---|---|---|
| Mar. 3, 1980 | [JP] | Japan | 55-36426 |
| Mar. 3, 1980 | [JP] | Japan | 55-36427 |
| Mar. 3, 1980 | [JP] | Japan | 55-36428 |
| May 16, 1980 | [JP] | Japan | 55-65131 |
| May 16, 1980 | [JP] | Japan | 55-65132 |

[51] Int. Cl.[3] .................... H01H 35/00

[52] U.S. Cl. .................... 307/116

[58] Field of Search .................... 307/116; 340/674

[56] References Cited

U.S. PATENT DOCUMENTS

| | | | |
|---|---|---|---|
| 3,219,992 | 11/1965 | Stuchberry et al. | 340/674 |
| 3,339,195 | 8/1967 | Murley | 340/674 |
| 3,927,336 | 12/1975 | Carlson et al. | 307/116 X |
| 4,031,408 | 6/1977 | Holz | 307/116 |
| 4,138,709 | 2/1979 | Colwill | 361/180 |

*Primary Examiner*—Donald A. Griffin

*Attorney, Agent, or Firm*—Schwartz, Jeffery, Schwaab, Mack, Blumenthal & Koch

[57] ABSTRACT

Electronic switching device comprising external terminals for connection with an external power source and a load, a detection circuit for generating a detection signal, a polarity switching circuit including an opto-coupler, and a power switching circuit for directly switching the load connected to the external terminals, said polarity switching circuit upon energizing or disenergizing the opto-coupler inverting the detection signal for application to the power switching circuit.

7 Claims, 11 Drawing Figures

3P 51 52 61 1 1a 2e 4b 1c 2b 2c 2a 40 53 60 2f 4c 2d 1b 2 3S 4 54

ELECTRONIC SWITCHING DEVICE

BRIEF SUMMARY OF THE INVENTION

This invention relates to an electronic switching device for sensing the presence or absence of an object and switching a load current of a load connected thereto, and more particularly to an improved switching device adapted to alternatively perform normally open and normally closed switching actions.

An electronic switching device, e.g. a proximity switch or photoelectronic switch, is well known which includes a pair of output circuits which respectively correspond to normally open and normally closed switching action modes and have the respective output terminals for alternative connections with a load. Since such a conventional switching device employs a pair of output circuits, it has the disadvantage that the device is costly and needs relatively large volumetric dimensions. An electronic switching device also is well known which inludes a manual mechanical operation switch disposed on a housing of the device so that a switching action mode thereof can be switched to a normally open or normally closed switching action mode by actuating the manual mechanical operation switch. Such a switching device also has the disadvantage that it has a low contact reliability because the manual mechanical operation switch generally employs mechanical contacts. Moreover, if the electronic switching device is small in size, the manual operation seitch is restricted in the mode of installation with respect to the device.

It is, therefore, a primary object of this invention to provide an electronic switching device which is of a non-mechanical switching construction and has a dual function of normally open and normally closed switching actions.

It is a further object of this invention to provide a compact electronic switching device which is small in size and economical.

It is a still further object of this invention to provide an electonic switching device which includes a plurality of power terminals, wherein by connecting a power source to the power terminals in a predetermined manner, the switching device is automatically switched to a predetermined switching action mode.

According to this invention, there is provided an electronic switching device comprising external terminal means for connecting the device with an external power source and a load, detection circuit means for developing a detection signal, polarity switching means for switching a polarity of the detection signal to a predetermined polarity and generating a switched signal, and output circuit means which, in response to the switched signal, switches the load connected to the device, said polarity switching means including an opto-coupler member which includes a first light projecting element connected to said external terminal means and a first light receiving element interposed between said detection and output circuit means, whereby, when said first light projecting element is energized, the polarity of the detection signal is automatically switched to said predetermined polarity by said first light receiving element coupled to said first light projecting element.

Other objects and advantages of this invention will be apparent upon reference to the following description in conjunction with the accompanying drawings, in which:

DETAILED DESCRIPTION

Figure 1:
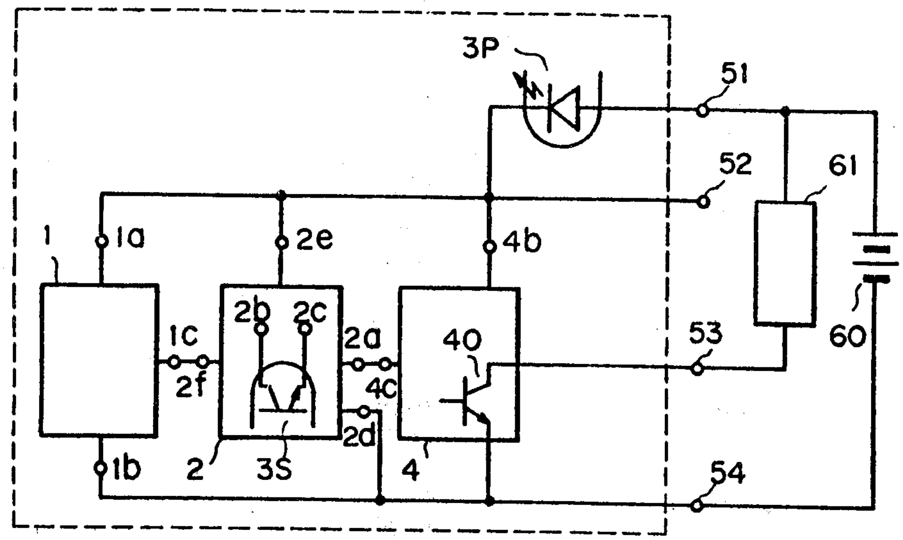
FIG. 1 is a schematic circuit diagram of an electronic switching device employing a single opto-coupler, which is adapted to be connected to a d.c. power source, as a preferred embodiment of this invention.

Referring, now, to FIG. 1, there is shown a d.c. three-wire electronic switching device as a preferred embodiment of this invention. The switching device consists of a detection circuit 1, a polarity switching circuit 2 including a light receiving element 3S, an output circuit 4, a light projecting element 3P, power terminals 51 and 52, an output terminal 53, and a common ground terminal 54.

Figure 8:
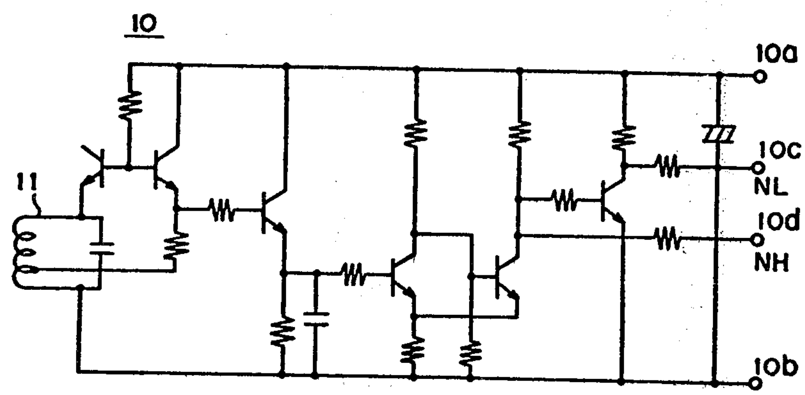
FIG. 8 is a diagram of a detection circuit which may be employed in the circuit of FIG. 7.

The detection circuit 1 provides a detection circuit means for sensing the presence or absence of an object to be sensed by this device and developing a detection signal at an output terminal 1*c*. The detection circuit may be any conventional detection circuit, such as a proximity switch-type detection circuit including an oscillation circuit the output of which varies on approach of the object, a photoelectronic switch detection circuit including a light receiving circuit the output of which varies on incidence of a light beam reflected by the object from a light source, or the like. In FIG. 8, there is shown a well known detection circuit 10 for a proximity switch as an example of the detection circuit 1 of FIG. 1. The detection circuit 10 includes an oscillation circuit having a detection coil 11, a signal processing circuit for processing output signals developed from the oscillation circuit, a normally low output terminal 10*c*, and a normally high output terminal 10*d*. The detection circuit 10 normally develops a low output at the terminal 10*c* and a high output at the terminal 10*d*.

When the object approaches to the detection coil 11, the output of the oscillation circuit varies, so that the detection circuit 10 develops a high output at the terminal 10*c* and a low output at the terminal 10*d*. Thus, a detection signal appears at the terminal 10*c* or 10*d*. When the detection circuit 1 of FIG. 1 is represented by the detection circuit 10, the output terminal 10*c* or 10*d* represents the output terminal 1*c*, and the terminals 10*a* and 10*b* represent the terminals 1*a* and 1*b*.

The polarity switching circuit 2 of FIG. 1 forms with the light projecting element 3P a polarity switching means for switching a polarity of a detection signal generated from the terminal 1*c* through an input terminal 2*f* to a predetermined polarity. The light projecting and receiving elements 3P and 3S are housed in a single package to form a single opto-coupler. The light projecting element or light source 3P may employ a light emitting diode or the like, and the light receiving element or light detector 3S may employ a phototransistor or the like. That is to say, as the light source 3*P* is energized, the light detector 3S also is energized by a light beam projected from the light source 3P.

Figure 3:
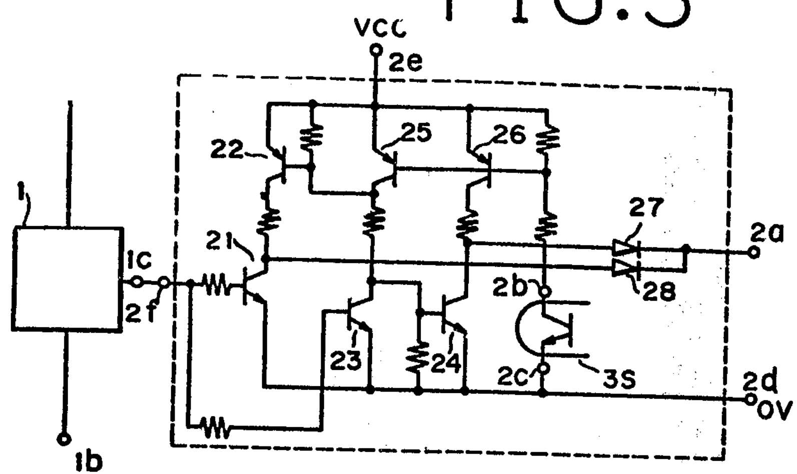
FIG. 3 is a schematic diagram of a polarity switching circuit which may be employed in the circuit of FIG. 1 or 2.

In FIG. 3, there is illustrated in detail the polarity switching circuit 2. Unless the light detector 3S is energized, there does not flow a sufficient current through the detector 3S to turn on transistors 25 and 26, so that a transistor 22 is turned to activate a transistor 21 but transistors 23 and 24 are turned off. Then, the detection signal applied to the transistor 21 through the input terminal 2*f* is inverted by the transistor 21 for application to the output terminal 2*a* through a diode 28. On the contrary, if the light detector 3S is energized so as to turn on the same, the transistors 25 and 26 are turned on, whereby the transistor 22 is turned off so as to cut off the transistor 21 but the transistors 23 and 24 are activated. Then, the detection signal applied to the transistor 23 through the input terminal 2*f* is twice inverted and is applied to the output terminal 2*a* through a diode 27. In other words, the detection signal applied to the terminal 2*f* is applied to the terminal 2*a* without being inverted. Thus, when the light detector 3S is disenergized, the detection signal applied to the terminal 2*a* is inverted and the inverted detection signal appears at the terminal 2*a*. When the detector 3S is energized, the detection signal appears at the terminal 2*a* without inversion.

Figure 4:
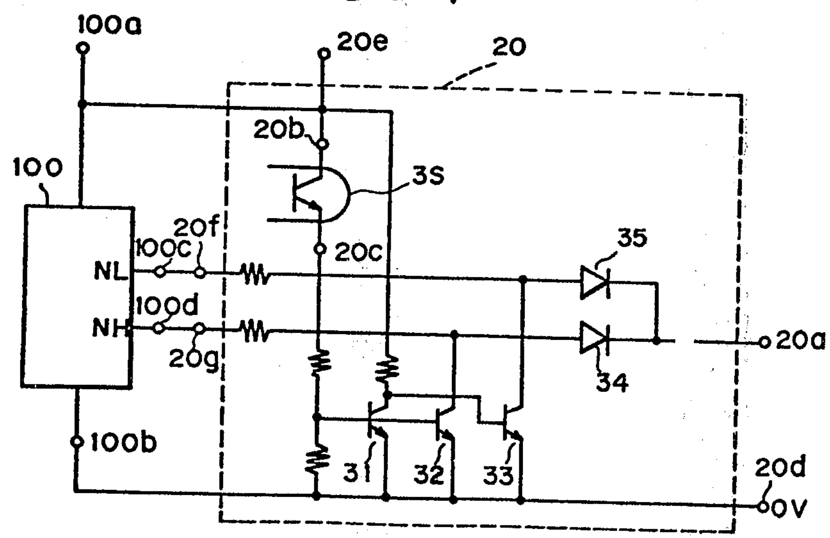
FIG. 4 is a schematic diagram of another polarity switching circuit which may be employed in the circuit of FIG. 1 or 2.

In FIG. 4, there is illustrated another polarity switching circuit 20 as a modification of the circuit of FIG. 3. The circuit 20 includes two input terminals 20*f* and 20*g* which are respectively connected to normally low and normally high output terminals 100*c* and 100*d*. A high output at the terminal 100*c* represents a detection signal developed in the circuit 100. On the other hand, a low output at the terminal 100*d* represents a reversed detection signal developed in the circuit 100. The detection circuit 10 of FIG. 8, for instance, may be employed as the circuit 100, in which the terminals 10*a*, 10*b*, 10*c* and 10*d* correspond to the terminals 100*a*, 100*b*, 100*c* and 100*d*, respectively. It should be understood that the detection circuit 100 is not limited to the circuit 10.

When light detector 3S is energized so as to turn on transistors 31 and 32, a transistor 33 is turned off. Then, the detection signal at the terminal 100*c* is directed to an output terminal 20*a* through a diode 35. When the detector 3S is disenergized, the transistors 31 and 32 are turned off and the transistor 33 is turned on. Then, the detection signal at the terminal 100*d* is directed to the terminal 20*a* through a diode 34.

The entire circuit of FIG. 4 can be utilized as detection and polarity switching circuits for the circuits 1 and 2 of FIG. 1, in which the terminals 100*a*, 100*b*, 20*e*, 20*a* and 20*d* represent terminals 1*a*, 1*b*, 2*e*, 2*a* and 2*d*, respectively. The circuitry of FIG. 3 or 4 is desirably assembled as an integrated circuit chip for decreasing the volumetric dimensions of the switching device of this invention. Since the terminal 2*c* or 20*b* of the detector 3S is commonly connected to the power terminal 2*d* or 20*e*, the total number of connecting terminals of the integrated circuit chip may be minimized.

Returning to FIG. 1, the detection signal developed from the detection circuit 1 is inverted by the circuit 2, the light detector 3S of which is disenergized. In case that the detection circuit 1 is designed so as to normally generate a high output at the terminal 1*c*, the output of the circuit 2 at the terminal 2*a* thereof is normally low during the time when the detector 3S is disenergized or normally high during the time when the detector 3S is energized. The output circuit 4 provides a power output circuit such that in response to an input signal applied to an input terminal 4*c* thereof, a switching element connected between output terminals 53 and 54 is rendered conductive. Since such a power output circuit is well known, the output circuit 4 is only schematically illustrated in FIG. 1. A NPN power transistor 40 as a switching element is connected to the associated inner circuit components (not shown in FIG. 1) within the circuit 4. The output terminals 53 and 54 are connected in series with a load 61 and a d.c. power source 60.

Thus, if the circuit 4 is designed so that in response to a high input applied to the terminal 4*c* the switching transistor 40 may be turned on, a high output at the terminal 2*a* causes the load 61 to be switched on by the circuit 4. Moreover, if the circuit 1 is designed so as to normally maintain a high output and the detector 3S is energized, the load 61 is normally turned on. Since the terminal 51 is connected through the light source 3P to the respective power input terminals 1*a*, 2*e* and 4*b*, when the terminal 51 is connected with the d.c. source 60, the light source 3P is energized to project a light beam for energization to the detection 3S because a constant power is consumed through the terminals 1*a*, 2*e* and 4*b* by the circuits 1, 2 and 4. If the terminal 52 is connected with the source 60 and the terminal 51 is free from the source 60, the light source 3P is not energized nor is the detector 3S energized. Thus, if the source 60 is connected to the terminal 51, the detection signal from the circuit 1 is not inverted by the circuit 2 and the load 61 is normally turned on. If the source 60 is connected to the terminal 52, the detection signal is inverted by the circuit 2 and the load 61 is normally turned off. Then, the respective terminals 51 and 52 may be designated as normally closed and normally open power terminals.

On the contrary, if the circuits 1, 2 and 4 are designed so that the terminals 51 and 52 may respectively act as the normally open and normally closed power terminals, the load 61 is switched in such a manner that upon d.c. power supply to the terminal 51 by the source 60 the load 61 is normally turned off but upon d.c. power supply to the terminal 52 the load 61 is normally turned on, viz., energized.

According to this embodiment, by alternatively connecting the power supply wire to the terminal 51 or 52, this electronic switching device provides a normally open or normally closed switching action for the load connected to the terminal 53. Though the switching apparatus of FIG. 1 is of three-wire type, the device may be modified into a two-wire type switch such that series-connected load and d.c. power source are adapted to be connected across the terminal 54 and the terminal 51 or 52 by connecting the output of circuit 4 to the terminal 4*b* and further including a certain supplemental circuit.

Figure 2:
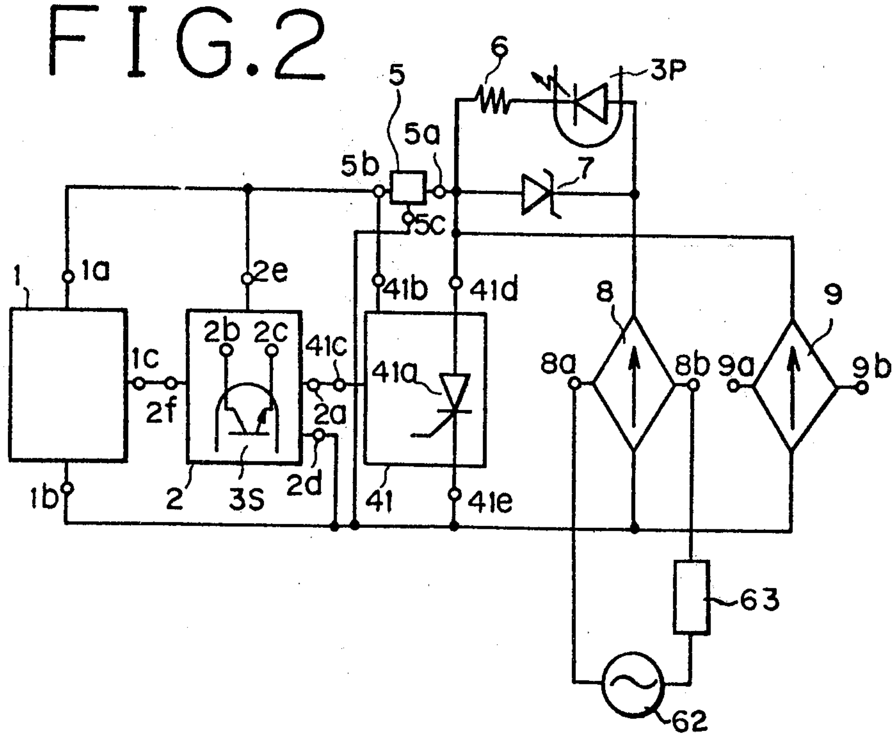
FIG. 2 is a schematic circuit diagram of an electronic switching device employing a single opto-coupler, which is adapted to be connected to an a.c. power source, as another embodiment of this invention.

In FIG. 2, there is shown a circuit of an a.c. two-wire electronic switching device for switching an a.c. load 63 connected in series with an a.c. power source 62, as another embodiment of this invention. The device includes detection and polarity switching circuits 1 and 2 which have the same constructions and functions as those of the device of FIG. 1. The above-described modifications of these circuits 1 and 2 of FIG. 1 also are available to the circuits 1 and 2 of FIG. 2. The switching device of FIG. 2 further includes an output circuit 41, voltage regulator 5, resistor 6, Zener diode 7, light source 3P, and a pair of rectifying circuits 8 and 9.

Figure 5:
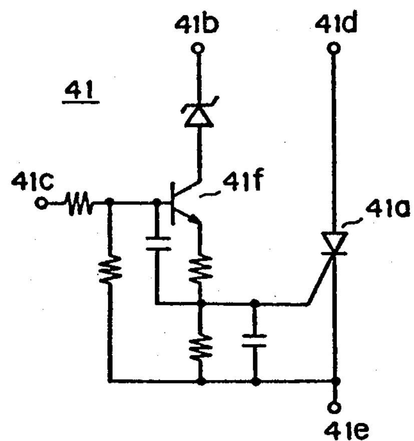
FIG. 5 is a diagram of an output circuit which may be employed in the circuit of FIG. 2.
Figure 6:
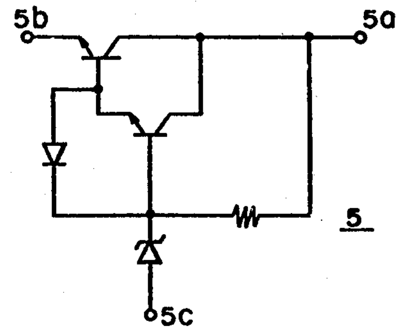
FIG. 6 is a circuit diagram of a voltage regulator which may be employed in the circuit of FIG. 2.

FIG. 5 shows a detailed schematic view of the output circuit of FIG. 2, which includes a thyristor 41*a* and a transistor 41*f*. Power input terminals 41*b* and 41*d* are respectively supplied with positive d.c. power. Upon receiving a positive high voltage at the gate of the thyristor 41*a* from an input terminal 41*c* through the transistor 41*f*, the thyristor 41*a* is turned on and current flows through the thyristor. In FIG. 6, there is shown in detail the voltage regulator 5 which regulates an inputted d.c. power at a terminal 5*b* thereof and provides a constantly regulated d.c. power at a terminal 5*b* thereof. It should be understood that the above-mentioned circuits 41 and 5 of FIGS. 5 and 6 are merely illustrative that other conventional circuits are applicable to the circuit of FIG. 2.

Returning to FIG. 2, the resistor 6 and Zener diode 7 are interposed so as to regulate a current flowing through the light source 3P within a normal condition.

When the series connected a.c. power source 62 and load 63 are coupled to a pair of terminals 8*a* and 8*b* of the rectifying circuit 8, the light source 3P is energized so as to turn on the light detector 3S, whereby a detection signal generated from the detection circuit 1 is twice inverted, viz. not inverted, in the polarity switching circuit 2 as illustrated in FIG. 3. If the detection circuit 1, for instance, is designed so as to normally generate a high output, a high input is normally applied to the terminal 41*c* and a load current normally flows through the thyristor 41*a*, Zener diode 7, rectifying circuit 8, load 63 and a.c. source 62. The terminals 8*a* and 8*b* provide a normally closed switching action mode. On the other hand, when the source 62 and load 63 are coupled to a pair of terminals 9*a* and 9*b*, the light source 3P is not energized, whereby the detection signal generated from the detection circuit 1 is inverted in the circuit 2 and a low input is normally applied to the terminal 41*c*. Then, the thyristor 41*a* is not fired, and any sufficient load current to turn on the load 63 does not flow through the series connected load 63, rectifying circuit 9 and thyristor 41*a*. The terminals 9*a* and 9*b* provide a normally open switching action mode.

The switching device according to this embodiment has the two separate pairs of normally closed power terminals (8*a*–8*b*, or 9*a*–9*b*) and the normally open power terminals (9*a*–9*b*, or 8*a*–8*b*), in wich the switching device is switched to normally closed or normally open switching action mode by alternatively connecting the series connected load and power source to one of the two separate pairs of power terminals.

Figure 7:
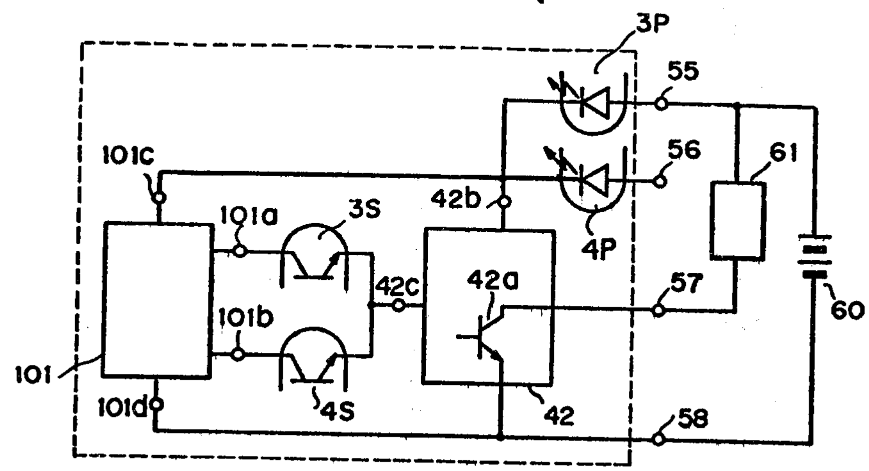
FIG. 7 is a schematic circuit diagram of an electronic switching device employing a pair of opto-couplers, which is adapted to be connected to a D.C. power source, as another embodiment of this invention.

Returning to FIG. 7, there is shown a schematic view of an electronic d.c. three-wire switching device, as another embodiment of this invention. The switching device employs a pair of opto-couplers 3P–3S and 4P–4S. A detection circuit 101 is provided with a normally low output terminal 101*a* and a normally high output terminal 101*b*. The detection circuit 10 illustrated in FIG. 8 may be utilized as the circuit 101. The light detectors 3S and 4S are connected to the input terminal 42*c* of switching power circuit 42 having NPN power switching transistor 42*a*, so that upon energizing the detector 3S, the transistor 42*a* is normally turned off or upon energizing the detector 4S, the transistor 42*a* is normally turned on. The switching power circuit 42 may be replaced with another conventional switching circuit, if desired. The circuits 101 and 42 are designed so as to consume a constant d.c. power through terminals 101*c* and 42*b*. When d.c. power source 60 and load 61 are connected to a first power terminal 55 as illustrated in FIG. 7, the light source 3P is energized so as to energize the light detector 3S, whereby the load 61 connected across terminals 55 and 57 is normally turned off. When the d.c. power source 60 and load 61 are connected to a second power terminal 56, the light source 4P is energized so as to energize the opto-detector 4S, whereby the load 61 connected across terminals 56 and 57 is normally turned on. Thus, the terminals 55 and 56 serve as normally open and normally closed switching action mode terminals, respectively. According to this embodiment, the electronic switching device is set to the normally closed or normally open switching mode by simply connecting the source 60 to one of the terminals 55 and 56. The electronic switching device may be modified in such a manner that as suggested in FIG. 9, the circuit 101 has a single output terminal commonly connected with collectors of the detectors 3S and 4S and the circuit 42 has a pair of input terminals separately connected to the respective emitters of the detectors 3S and 4S.

Figure 9:
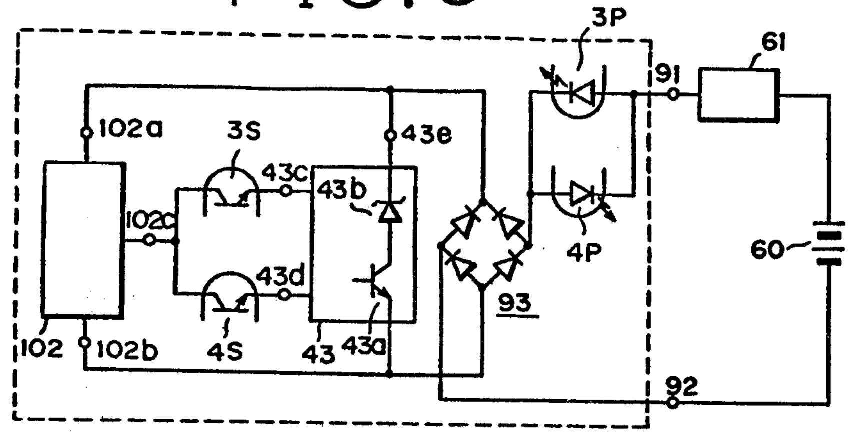
FIG. 9 is a schematic circuit diagram of an electronic switching device having a pair of external terminals as another embodiment of this invention.

FIG. 9 shows a schematic circuit of a d.c. two-wire electronic switching device as another embodiment of this invention. The switching device is provided with a pair of power terminals 91 and 92 for a bidirectional connection with series-connected load 61 and d.c. source 60. A rectifying circuit 93 is interposed so that the d.c. source 60 may be bidirectionally connected across the terminals 91 and 92. A detection circuit 102 is designed so as to normally generate a low output for application to detectors 3S and 4S. An output circuit 43 includes positive and negative input terminals 43*c* and 43*d*, in which a switching power transistor 43*a* is turned on by a high input applied to the terminal 43*c* or turned off by a high input applied to the terminal 43*d*. A Zener diode 43*b* is connected in series with the transistor 43*a* so that even when the transistor 43*a* is turned on, a sufficient power may be supplied to the circuit 102. When a positive power of the d.c. power source 60 is supplied to the terminal 91 through the load 61, the light source 3P is energized and the outputs generated from the circuit 102 are applied to the terminal 43*c*. Then, the transistor 43*a* is normally turned off but when a detection signal at a high level is developed from the detection circuit 102, is turned on. Thus, the switching device provides a normally open switching action for load 61. When the source 60 is reversely connected across terminals 91 and 92 so as to supply the possitive power to the terminal 92, the light source 4P is energized and the outputs generated from the circuit 102 are applied to the negative terminal 43*d*. Then, the transistor 43*a* is normally turned on but on receiving a detection signal from circuit 102, is turned off. Thus, the switching device provides a normally closed switching action mode. According to this embodiment, the switching device may provide a normally closed or a normally open switching action in accordance with a direction of the connection of the d.c. source 60 to the terminals 91 and 92. If desired, a protection circuit may be interposed to the light sources 3P and 4P in such a manner that as shown in FIG. 2, series connected resistor and light source (3P or 4P) are connected in parallel with a Zener diode as a shunt resistance.

Figure 10:
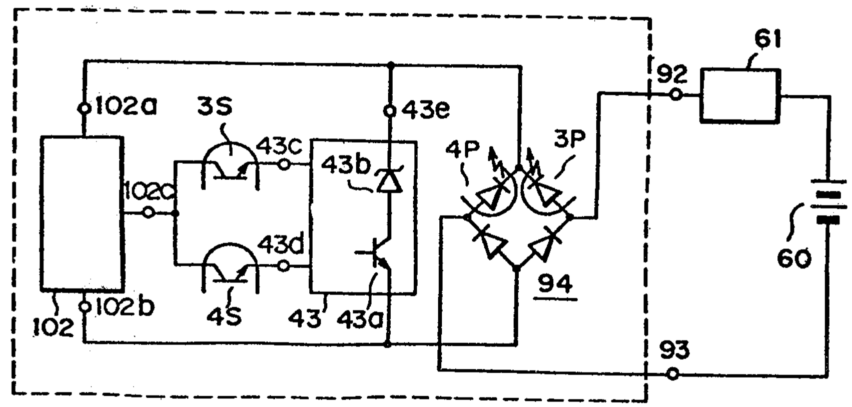
FIG. 10 is a circuit diagram of an electronic switching device as a modification of the embodiment of FIG. 9.

In FIG. 10, there is illustrated a schematic circuit of an electronic switching apparatus, as a modification of the embodiment of FIG. 9. A pair of light sources 3P and 4P are respectively interposed in a pair of arms of a rectifying circuit 94, and serve as rectifiers. The operation of the switching device is similar to that of the device of FIG. 9.

Since each of the switching devices of FIGS. 9 and 10 has only two connecting terminals and may be simply switched to a normally open or a normally closed switching action mode, it is advantageous for an extremely small miniature switching device.

Figure 11:
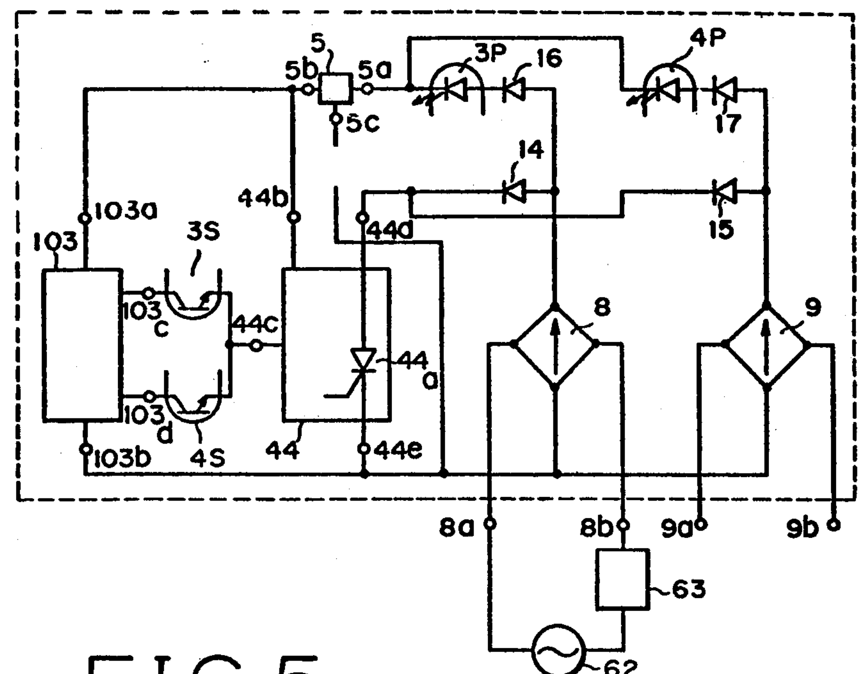
FIG. 11 is a schematic circuit diagram of an electronic switching device employing a pair of opto-couplers, which is adapted to be connected to an a.c. power source, as a modification of the embodiment of FIG. 2.

In FIG. 11, there is shown a schematic circuit of an a.c. two-wire electronic switching device, as a modification of the embodiment of FIG. 2. A detection circuit 103 is designed so as to normally generate a low output at a terminal 103*c* and a high output at a terminal 103*d*. The circuit 103 may, for instance, be the detection circuit of FIG. 8. A switching power circuit 44 includes a thyristor 44*a* which is adapted to be turned on by a high input applied to an input terminal 44*c*. The circuit 44 may be the circuit illustrated in FIG. 5. The reference numeral 5 is a voltage regulator which is shown in FIG. 6. Other reference numerals equivalent to those of FIG. 2 represent the same components as those of FIG. 2. Diodes 14, 15 16 and 17 are interposed so that a current flowing through the respective rectifying circuit 8 or 9 may be devided into a small current flowing through the regulator 45 and a load current flowing through switching gate (SCR) 44*a* and any reverse current may not flow through any of the diodes 14 to 17. Since, in practice, a circuit current flowing through the voltage regulator 5 into the circuits 103 and 44 is of the order of several milliamperes, the respective light sources 3P and 4P do not need any over-current protection circuits. In FIG. 2, the over-current protection circuit consisting of the current limit resistor 6 and the Zener diode 7 is connected with the light source 3P. Since the light source 3P must in practice be supplied with about 3V r.m.s. for emitting a light beam and a load current flowing through the Zener diode 7 is about several hundreds of milliamperes, a relatively large voltage drop is developed across the Zener diode 7. Such a drop causes a substantial drop of a voltage applied to the load 63, and is disadvantageous in practic. Moreover, the calorific volume emitted from the large capacity Zener diode is large, and is disadvantageous to the associated circuit components. On the other hand, in FIG. 11, the resective voltage drop across the diode 14 or 15 is fairly small because a load current flowing through the load 63 when the thyristor 44*a* is turned on substantially flows through the diode 14 or 15 in a forward direction. Moreover, since the switching device of FIG. 11 does not include any large capacity diode like the Zener diode 7 of FIG. 2 which needs large volumetric dimensions, the switching device can be miniaturized and the cost is reduced.

When the series connected load 63 and source 62 are connected across the terminals 8*a* and 8*b*, the opto-coupler 3P–3S is energized and the thyristor 44*a* is normally turned off. When the source 62 is applied between terminals 9*a* and 9*b*, the opto-coupler 4P–4S is energized and the thyristor 44*a* is normally turned on. Thus, the terminals 8*a* and 8*b* are for a normally open switching action mode,and the terminals 9*a* and 9*b* are for a normally closed switching action mode. The circuits 103, 44 and 5 may be modified in view of the foregoing embodiments.

It should be understood that the above description is merely illustrative of this invention and that many changes and modifications may be made by those skilled in the art without departing from the scope of the appended claims.

What we claimed is:

1. Electronic switching device comprising external terminal means for connecting the switching device with an external power source for power supply to the device and with a load for switching the same, detection circuit means for developing a detection signal, polarity switching means connected to said detection circuit means for switching a polarity of said detction signal to a predetermined polarity and generating a switched signal, and output circuit means connected to said polarity switching means for, in response to said switched signal, switching said load which is connected to said external terminal means, said polarity switching means including an optocoupler member which includes a first light projecting element connected to said external terminal means and a first light receiving element infterposed between said detection and output circuit means, whereby, when said first light projecting element is energized, the polarity of said detection signal is switched into said predetermined polarity by said first light receiving element.

2. Electronic switching device according to claim 1, wherein said external terminal means includes a normally-open power terminal and a normally-closed power terminal, said first light projecting element being connected to one of said normally open and closed power terminals.

3. Electronic switching device according to claim 2 which further comprises a pair of rectifying circuits respectively connected to said normally open and closed power terminals, and in which said first light projecting element is connected to one of said power terminals through one of said rectifying circuits.

4. Electronic switching device according to claim 1, wherein said opto-coupler member further comprises a second light projecting element connected to said external terminal means and a second light receiving element interposed between said detection and output circuit means, whereby, when one of said first and second light projecting elements is energized, the polarity of said detection signal is switched into one of polarities determined by said first and second light receiving elements.

5. Electronic switching device according to claim 4, wherein said external terminal means includes normally open and closed power terminals respectively connected to said first and second light projecting elements.

6. Electronic switching device according to claim 5 which further comprises a pair of rectifying circuits respectively connected to said normally open and closed power terminals, and in which each of said power terminals consists of a pair of external terminals connected to the corresponding one of said rectifying circuits and said first and second light projecting elements are respectively connected to said external terminals through said respectively connected rectifying circuits.

7. Electronic switching device according to claim 4, wherein said external terminal means consists of a pair of power terminals and said external power source is a d.c. source, said first and second light projecting elements being connected to said external terminal means in opposite directions so that said first and second light projecting elements may be alternatively energized in accordance with a polarity of the power applied to said power terminals by said d.c. source.

* * * * *